United States Patent [19]

Atherton et al.

[11] 4,348,596
[45] Sep. 7, 1982

[54] SIGNAL COMPARISON CIRCUIT

[75] Inventors: James H. Atherton, Flemington; Clifford P. Jindra, North Plainfield, both of N.J.

[73] Assignee: RCA Corporation, New York, N.Y.

[21] Appl. No.: 107,403

[22] Filed: Dec. 27, 1979

[51] Int. Cl.³ .................. H03K 17/687; H03K 19/092
[52] U.S. Cl. ................................... 307/264; 307/475; 307/530; 307/575
[58] Field of Search ............... 307/475, 362, 575, 530, 307/577, 494, 264

[56] References Cited

U.S. PATENT DOCUMENTS

| | | | |
|---|---|---|---|
| 3,533,087 | 10/1970 | Zuk | 340/173 |
| 3,882,326 | 5/1975 | Kruggel | 307/530 |
| 4,021,686 | 5/1977 | Zuk | 307/291 |
| 4,044,341 | 8/1977 | Stewart et al. | 340/173 |
| 4,068,138 | 1/1978 | Miyakawa et al. 307 | 362/ |
| 4,096,402 | 6/1978 | Schroeder et al. | 307/362 |
| 4,162,416 | 7/1979 | Beecham et al. | 307/362 |
| 4,164,791 | 8/1979 | Homma | 365/190 |

OTHER PUBLICATIONS

RCA Solid State Div, Preliminary Data File No. 1075, CO5/MOS High-Speed 8-Bit Bidirectional CMO5/TTL Interface Level Converter 5 sheets, 1/78.

Primary Examiner—Stanley D. Miller, Jr.
Assistant Examiner—B. P. Davies
Attorney, Agent, or Firm—Samuel Cohen; Henry I. Schanzer

[57] ABSTRACT

The circuit compensates for the difference in the source impedances of signal and reference generating circuits whose outputs are coupled to a sense circuit which loads (draws current from) the signal and reference generating circuits. The signal generating circuit has a source impedance ($R_1$) and produces either one of two ($V_{1H}$ or $V_{1L}$) output signal levels which is coupled via a first transmission gate having an "ON" impedance $R_2$ to a first input terminal of the sense circuit. The reference generating circuit has a lower source impedance ($R_3$) than the signal source and produces an output intermediate the two signal levels which is coupled via a second transmission gate having an "ON" impedance $R_4$ to a second input terminal of the sense circuit. The reference voltage applied to the second input of the sense circuit is maintained at a predetermined level between the high and low levels of the signal applied to the first input of the sense circuit, by making the sum of $R_3$ and $R_4$ proportional to the sum of $R_1$ and $R_2$.

9 Claims, 6 Drawing Figures

SIGNAL COMPARISON CIRCUIT

This invention relates to means for generating and maintaining a reference signal at a predetermined fraction between the high and low levels of a single being sensed.

In the design of high speed memories it is desirable to limit the voltage swing between the high voltage level (e.g. $V_H$) indicative of a logic "1" and the low voltage level (e.g. $V_L$) indicative of a logic "0" in order to decrease the time it takes for a "1" or a "0" to be produced and/or sensed. Where the voltage difference ($\Delta V$) between $V_H$ and $V_L$ is relatively small it is desirable, for example, to generate a reference voltage midway between $V_H$ and $V_L$ and to compare the signal to be sensed with the reference voltage.

Applicants' invention resides in part in the recognition that a problem exists where the source impedance of the circuit generating the signal to be sensed is different than the source impedance of the reference voltage generating circuit and where the sensing circuit loads (i.e. draws current from) the signal and reference generators. The loading by the sensing circuit alters and shifts the signal levels and the reference level by different amounts. For example, where the sense circuit draws equal currents through the reference and signal generators and where the source impedance of the reference is less than that of the signal generator, the reference signal of the sense amplifier will be offset (e.g. shifted upwards relative to the signal) towards one of the two signal levels, decreasing the margin between one of the signal levels and the reference signal. The system's ability to distinguish the high and low signal levels relative to the reference level is thereby degraded.

Applicants further recognized that, in general, a problem exists where the voltage drop ($I_{L2}R_1$) across the source impedance of a signal generator plus the voltage drop ($I_{L2}R_2$) across the impedance means coupling the signal generator to the sense circuit due to the sense circuit load current ($I_{L2}$) through them is not equal to the voltage drop ($I_{L1}R_3$) across the source impedance of a reference generator plus the voltage drop ($I_{L1}R_4$) across the coupling means coupling the reference generator to the sense circuit due to the sense circuit load current ($I_{L1}$) through them. When the inequality exists, any change in $I_{L1}$ and $I_{L2}$ even where the changes in $I_{L1}$ and $I_{L2}$ are equal (or proportional) results in unequal changes in the reference voltage and the signal voltage applied to the sense circuit.

Applicants' invention also resides in the means for generating a reference signal and maintaining the reference signal at the input to the sense circuit at a fraction between the two levels, (high and low), of a signal to be sensed as will be discussed in detail below.

Circuits embodying the invention include a signal generator (e.g. a memory cell) having a source impedance $R_1$ and an output at which signals are produced having either one of a high value ($V_{1H}$) or a low value ($V_{1L}$). The signal generator output is coupled via the "ON" impedance $R_2$ of a first coupling means to a first input of a sense circuit. A reference generator (e.g. a reference cell) having a source impedance $R_3$ has an output at which is produced a reference signal ($V_2$) having a value intermediate $V_{1H}$ and $V_{1L}$. The reference generator is coupled via the "ON" impedance $R_4$ of a second coupling means to a second input of the sense circuit. The sense circuit is of the type which has direct current conduction paths between its first and second inputs and a point of reference potential. Consequently, the sense circuit causes:

1. A first current ($I_{L1}$) to flow through $R_3$ and $R_4$ causing the reference signal ($V_2$) at the second (e.g. reference) input of the sense circuit to be offset by an error term equal to $I_{L1}(R_3+R_4)$; and
2. A second current ($I_{L2}$) to flow through $R_1$ and $R_2$ causing the signals ($V_{1H}$ or $V_{1L}$) at the first (e.g. signal) input to be offset by an error term equal to $I_{L2}(R_1+R_2)$.

In circuits embodying the invention the error terms are cancelled by making $I_{L1}(R_3+R_4)=I_{L2}(R_1+R_2)$. This results in:

$$R_3+R_4=K(R_1+R_2) \qquad \text{eq. 1}$$

where $K=I_{L2}/I_{L1}$.

For the values of $R_1$, $R_2$, $R_3$ and $R_4$ satisfying equation 1 above, $V_R$ may be set at any arbitrary point between $V_{SL}$ and $V_{SH}$ and its position relative to $V_{SH}$ and $V_{SL}$ will be maintained even though the loading of the sense circuit may change (i.e. the "load" currents ($I_{L1}$ and $I_{L2}$) may increase or decrease) so long as K remains constant.

In the accompanying drawing like reference characters denote like components, and FIG. 1 is a schematic diagram of a circuit embodying the invention;

Figure 1:
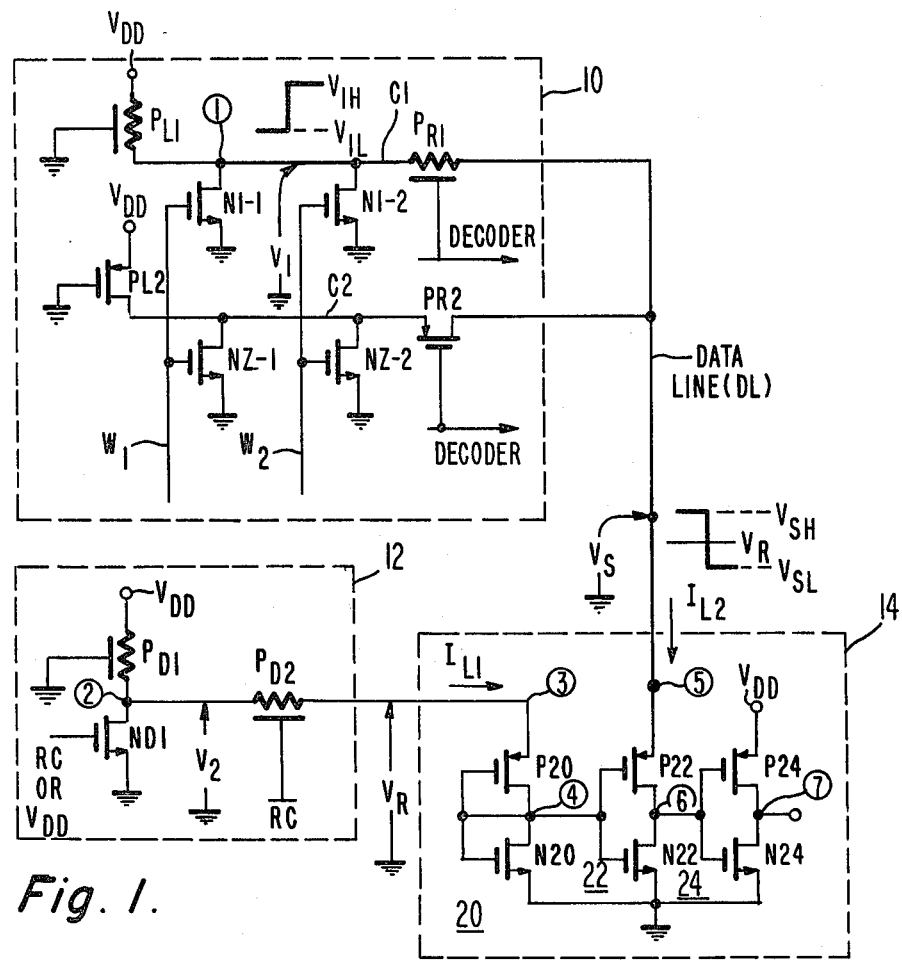

The circuit of FIG. 1 includes a Read Only Memory (ROM) array 10, a "dummy" (reference) cell 12, and a sense amplifier 14 for comparing a signal output from array 10 with a reference signal generated by cell 12.

The structure and operation of blocks 10 and 12 will first be described for the condition when the blocks 10 and 12 are decoupled (transmission gates PR1 and PD2 are OFF) from the sense circuit 14 which is defined herein as the "no load" condition.

The ROM array 10 (only two columns and two words of which are shown) is comprised of 2 bit line (column) conductors ($C_1$, $C_2$) and row (Word) conductors ($W_1$, $W_2$) disposed in an orthogonal direction to the bit line conductors. Each intersection of a row conductor and a bit line conductor defines a bit location. There is a single data storage (memory cell) IGFET, Ni-j, of N conductivity type at each bit location. The gate electrode of each IGFET in a word is connected to the word conductor for that word and the source electrodes of all the N-IGFETs are connected to ground. Each IGFET at a bit location either has: (a) its drain connected to its associated bit line conductor in which event that bit location (e.g. N1-1, N2-2) is arbitrarily defined as storing a logic "0"; or (b) its drain is disconnected from its associated bit line conductor in which event that bit location (e.g. N1-2, N2-1) is arbitrarily defined as storing a logic "1".

The conduction path of a P-type load IGFET (PL1,PL2) is connected between each column (bit line) conductor and $V_{DD}$ which is typically 5 volts. The gate electrodes of the load IGFETs are connected to ground potential so that the load IGFETs are always conducting and the column conductors are normally at, or very close to, $V_{DD}$. (IGFET PL1 as well as IGFETs PR1, PD1, and PD2 are drawn with a resistive symbol in their conduction paths to indicate that, when ON, they are operated as resistive elements).

The contents of the cells of ROM 10 associated with a selected word line $W_1$ are read by applying a potential of $V_{DD}$ volts to that word line. This turns on all the memory cell IGFETs whose gates are connected to that word line. A memory cell IGFET (e.g. N2-1) whose drain is not connected to a bit line conductor does not conduct a current and its corresponding bit line conductor (e.g. $C_2$) under "no load" condition remains at $V_{DD}$ (logic "1") due to its turned-on load IGFET (e.g. PL2). A memory cell IGFET (e.g. N1-1) whose drain is connected to a bit line conductor conducts a saturation current (I) and the potential (e.g. $V_1$) of that bit line (e.g. $C_1$) under "no load" condition drops to $[V_{DD}-IZ_{PL}]$, corresponding to logic "0"; where $Z_{PL}$ is the impedance of the load device (e.g. PL1) connected to that column.

The swing between the logic "1" level ($V_H$) and the logic "0" level ($V_L$) is intentionally made small by making the impedances ($Z_{Nij}$) of the conduction paths of the N-type IGFETs, all of which are approximately equal to each other, much larger than the impedances ($Z_{PL}$) of the load IGFETs (PLi), all of which are approximately equal to each other. To make the memory as dense as possible, the memory cell transistors (Ni-j) are made as small as possible. It is important to conserve area because the ROM may have, in some cases, 64,000 (or more) memory cell transistors and it is desired that they all fit on the same chip. The impedance (Z) of an IGFET is a function of its physical size, which can be relatively well controlled. $Z=f(L/W)$ where L is the channel length and W is the channel width. Hence, the ratio of the sizes (and impedances) of the IGFETs (P and N) to each other is well defined.

The "dummy" or reference cell 12, which includes IGFET PD1 and ND1, functions to generate a reference voltage ($V_2$) intermediate the $V_{1H}$ and $V_{1L}$ voltage levels of the ROM cells. The conduction path of PD1 is connected between $V_{DD}$ and a node 2 and the conduction path of ND1 is connected between node 2 and ground. The gate electrode of PD1 is returned to ground potential while a read-control pulse (RC) is applied to the gate electrode of ND1. PD1, which is of the same conductivity type as the load devices PLi, is designed to have an impedance $Z_{PD1}$ equal to one-half the impedance of $Z_{PL}$. In practice, PD1 may be formed by connecting, in parallel, the conduction paths of two transistors similar to the PLi transistors. PD1 is then effectively twice the size of the PLi transistors and its $Z_{PD1}$ is equal to $Z_{PL}/2$. IGFET ND1 is of the same conductivity type and size as the memory cell N-type IGFETs of the ROM. Making ND1 the same size as the memory cell transistors ensures tracking over temperature, voltage, and fabrication processing. As an aside, it would be difficult to make ND1 smaller than the Ni-j transistors since as a practical matter, the latter are already made about as small as can be managed with an acceptable yield. A read-control (RC) pulse having an amplitude of $V_{DD}$ volts is applied to the gate electrode of ND1 during a read cycle. This is the same amplitude turn-on signal ($W_i = V_{DD}$) that is applied to the gate electrodes of the memory cell transistors. Hence, ND1, when turned on, conducts a saturation current (I) which is approximately equal to the current (I) conducted by a turned-on memory cell transistor. Therefore, the voltage drop across PD1 due to the current I under "no load" condition, is approximately one-half ($\frac{1}{2}$) that across PLi (since $Z_{PD1} = \frac{1}{2}Z_{PL}$) when a current I flows through PLi.

In general, under "no load" condition, the signal voltage (e.g. $V_1$) produced on any of the bit line conductors will be equal to one of: (a) $V_{DD}$ volts, or (b) $[V_{DD} - \Delta V]$ volts; where $\Delta V$ is equal to $(I) \cdot (Z_{PL})$, and where I is the saturation current through a memory cell N-type IGFET or ND1. The reference voltage ($V_2$) at node 2, under "no load" condition, is equal to $[V_{DD} - \Delta V/2]$ volts, since $I_{ND1} = I_{Nij}$ and $Z_{PD1} = Z_{PDi}/2$.

The information generated on a bit line conductor ($C_1$, $C_2$) is selectively coupled via its associated transmission gate transistor (PR1, PR2) to a data line (DL) which is connected to node 5 which is a signal input of sense circuit 14. The reference cell output ($V_2$) is coupled via a transmission gate transistor PD2 to a node 3 which defines another input terminal of circuit 14. With the turn on of PD2 and any of the PRi transistors, the memory cells signals on Ci and the reference signal $V_2$ are respectively "loaded". In more detail, with PD2 on, a load current ($I_{L1}$) flows between nodes 2 and 3, which current flows from $V_{DD}$ via PD1 and PD2 into node 3. Similarly, with the turn-on of any of the PRi transistors, a load current ($I_{L2}$) flows from $V_{DD}$ via PLi and PRi into node 5.

Thus, to read data out of memory 10, a word line (Wi) is energized ($V_{DD}$ is applied to it) and a gating transistor (PRi) is turned on coupling a selected column (bit line) conductor to the data line and hence to node 5. Concurrently, RC goes positive turning on ND1 and establishing a reference signal, and $\overline{RC}$ goes negative turning on PD2 which couples the reference signal to node 3.

The sense amplifier 14 includes a bias generating stage 20 comprised of transistors P20 and N20, a signal sensing stage 22 comprised of transistors P22 and N22, and a buffer stage 24 comprised of transistors P24 and N24.

The conduction paths of transistors P20 and N20 are connected in series between node 3 and ground. The gates and drains of P20 and N20 and the gates of P22 and N22, are connected in common to node 4. The conduction paths of P22 and N22 are connected in series between node 5 and ground and the drains of P22 and N22, defining the output node 6 of stage 22, are connected to the gate electrodes of P24 and N24. The sources of P24 and N24 are connected to $V_{DD}$ and ground, respectively, and their drains are connected in common to the sense amplifier output node 7.

In the circuit of FIG. 1, P20 and N20 are designed to have approximately equal impedances for equal values of turn on bias. By connecting the gates and drains of P20 and N20 in common, P20 and N20 function as a self-biased inverter whose quiescent point ($V_4$ at node 4) is set approximately at the mid point of the operating potential applied across the inverter. The operating potential across inverter 20 is the difference between the potential ($V_3$) applied to the source of P20 and the potential (0 volts) applied to the source of N20. Hence, V₄ which is directly applied to the gates of P22 and N22 functions as the bias voltage to stage 22 placing it in its high gain region. P22 and N22 are also designed to have approximately equal impedances (i.e. $Z_{P22}=Z_{N22}$) for equal values of turn-on bias. P22 and N22 then form a complementary inverter whose "flip-point" voltage ($V_{FP}$) is equal to ½ the operating potential ($V_P=V_5$) applied across the inverter stage 22.

$V_P$ across stage 22 is the difference between the potential ($V_5$) applied to the source of P22 and the potential (0 volts) applied to the source of N22. $V_{FP}$ of inverter 22 for the condition of $Z_{P22}=Z_{N22}$, is equal to $V_5/2$.

Sense amplifier 14 compares the signal applied to input node 5 (which may be $V_{SH}$ or $V_{SL}$) with $V_R$ at input node 3 and produces at the output of stage 22 a signal indicative of whether the signal at node 5 is more positive than, equal to, or less positive than $V_R$. The detailed explanation of the operation of the sense amplifier is set forth in our copending application entitled SMALL SIGNAL MEMORY SYSTEM, assigned to the assignee of this application bearing Ser. No. 106,882 and issued as U.S. Pat. No. 4,270,190 and is incorporated herein by reference.

In the discussion to follow, it is assumed that inverter 20 conducts a current ($I_L$) between node 3 and ground and that inverter 22 conducts a current ($KI_L$) between node 5 and ground; where K is a constant which is a function of the ratio of the impedances of the transistors in stage 22 to the impedances of the transistors in stage 20. Assuming all the transistor channels to have the same length, K may be expressed as follows: $K=W_{P22}/W_{P20}=W_{N22}/W_{N20}$ where $W_{P20}$, $W_{P22}$, $W_{N20}$ and $W_{N22}$ are, respectively, the channel widths of transistors P20, P22, N20 and N22.

For the condition $Z_{P20}=Z_{N20}$ and $Z_{P22}=Z_{N22}$, inverters 20 and 22 are biased near their midpoint. Hence, for the particular condition $W_{P20}=W_{P22}$ and $W_{N20}=W_{N22}$, the load current ($I_L$) flowing between node 3 and ground is approximately equal to that flowing between node 5 and ground (K is equal to 1).

The load currents into nodes 3 and 5 cause a shift in the signal at nodes 1, 2, 3 and 5, which is best explained by reference to FIG. 2 which is a simplified equivalent circuit diagram of portions of the circuit of FIG. 1.

Figure 3:
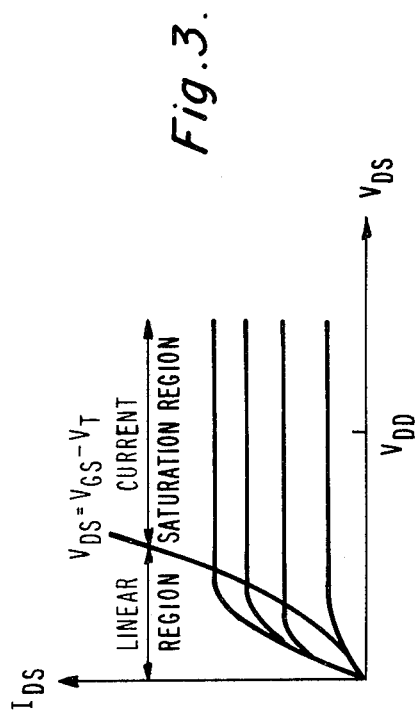
FIG. 3 is a drawing of the $I_{DS}$ versus $V_{DS}$ of a typical IGFET.

Transistors Ni-j and transistor ND1 may be represented by current sources 21 and 23. Transistors Ni-j and transistor ND1 are operated in the current saturation region. When any one of the memory transistors Ni-j is turned-on, or when transistor ND1 is turned-on, a potential of $V_{DD}$ volts is applied to its gate while its source remains grounded. Therefore, its gate-to-source potential ($V_{GS}$) is constant. Also, the impedances of ND1 and of the memory transistors are significantly greater than the impedances of the load IGFETs connected in their drain circuits. Consequently, when these transistors are turned-on and connected in circuit, most of the voltage drop (between $V_{DD}$ and ground) occurs across their drain-to-source paths rather than the drain-to-source path of the load transistors. Each one of the memory transistors, when connected in circuit and ND1, when turned-on, then functions as a relatively constant current generator, whose pertinent characteristics may be noted by reference to FIG. 3 which shows a typical drain-to-source current ($I_{DS}$) versus drain-to-source voltage ($V_{DS}$) curve of an IGFET for constant values of $V_{GS}$. For $V_{DS}$ greater than $V_{GS}-V_T$, where $V_T$ may be assumed to be in the range of 1 volt, the $I_{DS}$ versus $V_{DS}$ response curve is very flat, for constant values of $V_{GS}$. Hence, the current ($I_{DS}$) through the transistor remains essentially constant, even though the $V_{DS}$ across the transistor may be decreased until $V_{DS}=V_{GS}-V_T$ or increased to $V_{DD}$.

Transistors Ni-j and/or ND1 should be represented by an ideal current generator in parallel with an output impedance which is a measure of the flatness of the response curve. However, the output impedance is in the order of meghoms ($10^6$ ohms) which is much larger than the ohmic values of the load impedance. Hence, the output impedance may be ignored in this discussion. Thus, in FIG. 2 resistor $R_1$ represents the ohmic value of a load transistor (e.g. PL1). Resistor $R_2$ represents the ohmic value of a turned-on column transmission gate transistor (PRi) plus all the conductor impedances. Resistor $R_3$ represents the ohmic value of the "reference" load transistor PD1, which in the circuit of FIG. 1, is equal to $R_1/2$. Resistor $R_4$ represents the ohmic value of the compensation and coupling transmission gate transistor PD2. $I_{L1}$ represents the d.c. current drawn by inverter stage 20, while $I_{L2}=KI_{L1}$ represents the d.c. current drawn by inverter stage 22.

Figure 2:
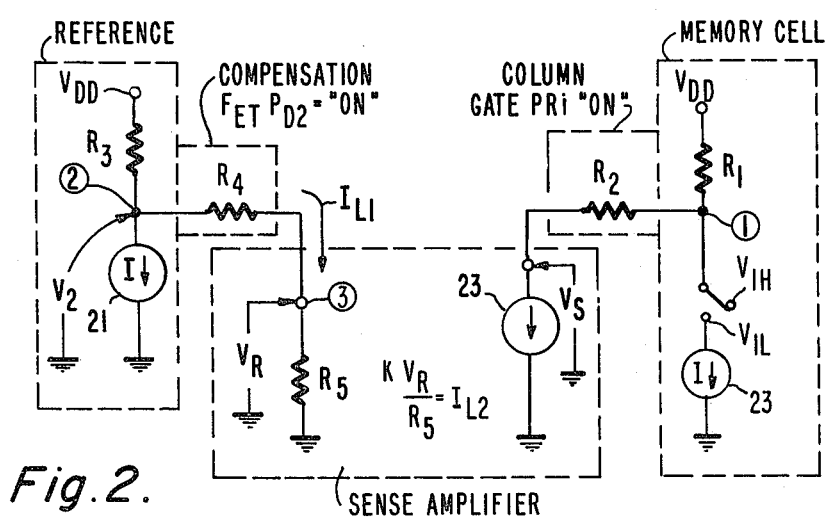
FIG. 2 is a schematic diagram of a simplified equivalent circuit of FIG. 1.

An examination of FIGS. 1 and 2 indicates that when transmission gates PD2 and PRi are turned on, currents $I_{L1}$ and $I_{L2}$ flow into nodes 3 and 5, respectively. These currents cause an additional voltage drop across resistors $R_3$ and $R_1$. Thus, the values of $V_1$ and $V_2$ prior to the turn-on of the transmission gates (defined as the "unloaded" condition) are not the same as their values after the turn-on of the transmission gates. Furthermore, $V_{1H}$, $V_{1L}$ and $V_2$ shift down to the voltages $V_{SH}$, $V_{SL}$, and $V_R$, respectively, due to the "load" currents $I_{L2}$ and $I_{L1}$, respectively.

The expression for the high level ($V_{SH}$) and low level ($V_{SL}$) signals voltages applied to node 5 of the sense amplifier may be expressed as follows:

$$V_{SH}=V_{DD}-I_{L2}(R_1+R_2) \qquad \text{eq. 2a}$$

$$V_{SL}=V_{DD}-IR_1-I_{L2}(R_1+R_2) \qquad \text{eq. 2b}$$

The expression for the voltage $V_R$, applied to node 3 of the sense amplifier may be expressed as follows:

$$V_R=V_{DD}-IR_3-I_{L1}(R_3+R_4) \qquad \text{eq. 3}$$

Comparing equations 2a, 2b and 3 it may be observed that each equation includes a "pure signal" term and an "error" term.

The "pure signal" terms in equations 2a, 2b and 3 are, respectively: $V_{DD}$; [$V_{DD}-IR_1$]; and [$V_{DD}-IR_3$]. The error term in equation 2a is equal to [$I_{L2}\cdot(R_1+R_2)$] which is equal to the error term in equation 2b. The error term in the "reference" equation 3 is equal to [$I_{L1}\cdot(R_3+R_4)$]. Applicants recognized that making the error term $I_{L2}(R_1+R_2)$ in equations 2a and 2b equal to the error term $I_{L1}(R_3+R_4)$ in equation 3 prevents the reference signal applied to node 3 of the sense circuit from being shifted by a different amount than the memory signals applied to node 5. These error terms are made equal by maintaining the relationship shown in equation 1 (which is repeated below) among $R_1$, $R_2$, $R_3$ and $R_4$.

$$R_3+R_4=K(R_1+R_2) \qquad \text{eq. 1}$$

where K is the ratio of $I_{L2}$ to $I_{LI}$.

The significance of satisfying equation 1 is that $V_R$ remains at a fixed fraction between $V_{SH}$ and $V_{SL}$ for any change in $I_{L1}$ and $I_{L2}$, so long as K is constant.

For the condition of FIG. 1 where $V_R$ is desired to be set midway between $V_{SH}$ and $V_{SL}$, and where equal currents (I) flow in transistor Ni-j and ND1, $R_3$ is made equal to $R_1/2$.

Further in FIG. 1 since $I_{L1}$ is equal to $I_{L2}$, $R_4$ is made equal to $R_2 + R_1/2$, such that $R_3 + R_4 = R_1 + R_2$. Thus, transmission gates were made equal ($R_2 = R_4$) and $R_3 \ne R_1$.

Figure 4C:
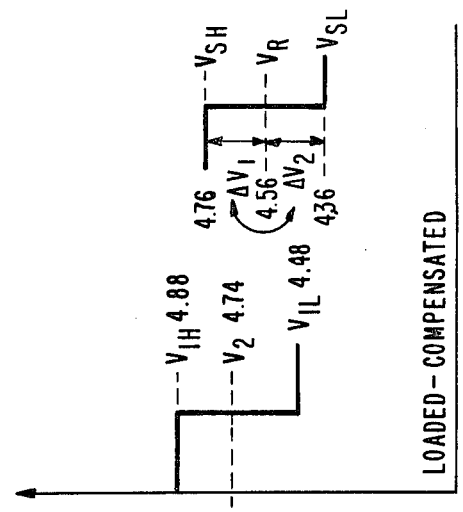
FIG. 4 is a diagram of voltage levels associated with certain nodes of the circuit of FIG. 1 under different conditions.

C. The "loaded compensated" condition is set forth at line C of TABLE 1 and is depicted in FIG. 4C. The loaded condition consists of coupling the signal and reference generators to the sense amplifier. The compensated condition consisted of making the sum of $R_3$ and $R_4$ equal to the sum of $R_1$ and $R_2$, (since $I_{L1}$ was equal to $I_{L2}$, K was equal to 1).

TABLE I

| | $V_{1H}$ | $V_2$ | $V_{1L}$ | $V_{SH}$ | $V_3 = V_R$ | $V_{SL}$ |
|---|---|---|---|---|---|---|
| A. NO LOAD CONDITION- PRi and PD2 OFF | $V_{DD}$ | $V_{DD} - IR_1/2$ | $V_{DD} - IR_1$ | — | — | — |
| $R_1$ = 1K ohms<br>$R_3 = R_1/2 = 500$<br>$I = 400 \times 10^{-6}$ amperes<br>$I_L = 0$ | 5.00 V | 4.800V | 4.600V | | | |
| B. LOADED-UN-COMPENSATED PRi and PD2 ON | $V_{DD} - I_L R_1$ | $V_{DD} - [R_1/2] \times$ $[I + I_L]$ | $V_{DD} - [R_1] \times$ $[I + I_L]$ | $V_{DD} - I_L$ $[R_1 + R_2]$ | $V_{DD} - IR_1/2$ $- I_L(R_3 + R_4)$ | $V_{DD} - IR_1$ $- I_L(R_1 + R_2)$ |
| $R_1 = R_2 = R_4$ = 1K ohm;<br>$R_3 = R_1/2$<br>$I = 400 \times 10^{-6}$ amperes<br>$I_{L1} = I_{L2} = I_L$<br>$I_L = 120 \times 10^{-6}$ amperes | 4.880V | 4.740V | 4.480V | 4.760V | 4.620V | 4.360V |
| C. LOADED AND COMPENSATED PRi and PD2-ON | 4.880V | 4.74V | 4.48V | $V_{DD} - I_L$ $[R_1 + R_2]$ 4.76V | $V_{DD} - IR_1/2$ $- I_L(R_3 + R_4)^*$ 4.56V $^*R_1 + R_2 =$ $R_3 + R_4$ | $V_{DD} - IR_1$ $- I_L(R_1 + R_2)$ 4.36V |
| $I_{L1} = I_{L2} = I_L$<br>$R_3 = R_1/2$<br>$R_4 = R_2 + \frac{1}{2} R_1$<br>$R_3 + R_4 =$<br>$R_1 + R_2$<br>$I = 400 \times 10^{-6}$<br>$I_L = 120 \times 10^{-6}$ | | | | | | | for the circuit of FIG. 1, $V_R$ is set midway between $V_{SH}$ and $V_{SL}$ and will remain in that position so long as $K = I_{L2}/I_{L1} = 1$.

By way of example, a circuit embodying the invention was built in which: (a) the current (I) drawn by the Ni-j transistors and ND1 was 400 microamperes ($400 \times 10^{-6}$ amperes); (b) $R_1$—the impedance ($Z_{PL}$) of the PLi transistors—was approximately 1 Kohm; (c) $R_3$—the impedance of PD1—was 500 ohms; (d) $V_{DD}$ was equal to 5 volts; (e) the d.c. current drawn by inverters 20 and 22 were each equal to 120 microamperes, i.e. K was equal to 1; (f) $R_2$—the "ON" impedance of PRi—was 1 Kohm; and (g) $R_4$—the "ON" impedance of PD2—was 1.5 Kohms (equal to $R_2 + \frac{1}{2} R_1$).

Figure 4B:
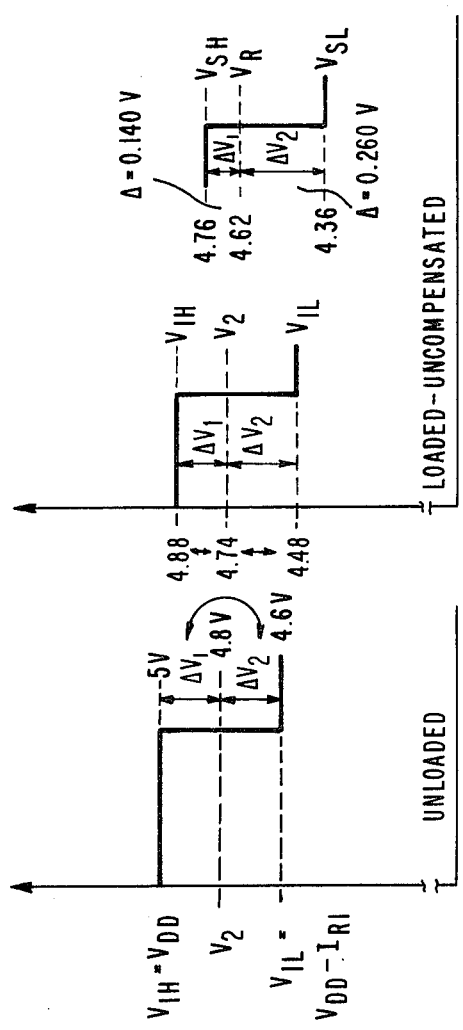
Figure 4A:
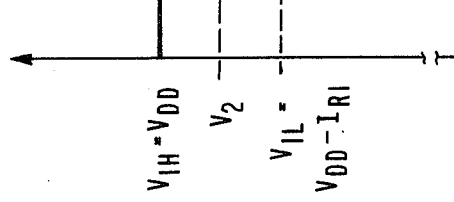

The shifting of the reference and signal voltages due to the current drawn by the sense circuit is tabulated in TABLE 1 below and is illustrated graphically in FIG. 4 for the following three conditions:

A. The "NO LOAD" condition which occurs when transmission gates PRi and PD1 are "OFF". The status of the signal generator and reference generator when decoupled from the sense amplifier is set forth at line A of TABLE 1 and is depicted in FIG. 4A.

B. The "loaded uncompensated" condition is set forth at line B of TABLE I and is depicted in FIG. 4B. The "load" condition occurs when PD1 and a PRi transistors are turned on and the signal and reference generators are coupled to the sense amplifier. The circuit is "uncompensated" in that the impedances of the It is evident from TABLE I and FIG. 4 that for the uncompensated condition $V_{SH} - V_R = 0.140$ volts; whereas $V_R - V_{SL} = 0.260$ volt. Thus, the margin for one condition would be almost twice that for the other condition.

For the compensated condition, there is equal margin between $V_R$ and the $V_{SH}$ and $V_{SL}$ conditions. Of additional significance is that the position of $V_R$ between $V_{SH}$ and $V_{SL}$ is independent of changes in $V_{DD}$ and, is independent of changes in the load currents drawn by the sense circuit so long as $I_{L1} = I_{L2}$.

For the input to the sense circuit being equivalent to current sources there is no attenuation of the difference between $V_{1H}$ and $V_{1L}$ generated when the circuit is unloaded. The signals ($V_{SH}$ and $V_{SL}$) and the reference $V_R$ are only shifted down with respect to $V_{1H}$ and $V_{1L}$.

In some circuit $V_R$ may be desirably set at some point other than midway between $V_{SH}$ and $V_{SL}$. For these conditions the equations derived above may be modified as follows:

$$V_R = V_{SL} + C\Delta V \qquad \text{eq. 4}$$

where: $\Delta V = V_{SH} - V_{SL}$; and C, which is a fraction less than 1, determines the point between $V_{SH}$ and $V_{SL}$ at which $V_R$ is set. To set $V_R$ at $V_{SL} + C\Delta V$, the value of $R_3$ may be defined as follows:

$$R_3 = R_1 [1 - C] \qquad \text{eq. 5}$$

while the relationship between $R_1$, $R_2$, $R_3$ and $R_4$ is still as described in equation 1 above.

It has thus been shown that $V_R$ may be set to any arbitrary point between $V_{SH}$ and $V_{SL}$ and that the signal and reference generator circuits may be compensated to ensure that $V_R$, $V_{SH}$ and $V_{SL}$ are all shifted by the same amount, so long as the ratio $K=I_{L2}/I_{L1}$ does not change.

In the circuit of FIG. 1 it was assumed that the currents (I) in transistors Ni-j and ND1 were equal. However, it should be evident that where desired the current ($I_A$) through Ni-j could be different than the current ($I_B$) through ND1.

The "signal terms" in equation 2a, 2b, and 3 would then be $V_{DD}$; $V_{DD}-I_A R_1$; and $V_{DD}-I_B R_3$. But, so long as $I_A R_1$ is greater than $I_B R_3$, $V_R$ will be positioned between $V_{SH}$ and $V_{SL}$, and, so long as the requirements of equation 1 are satisfied $V_R$ will maintain its position between $V_{SH}$ and $V_{SL}$.

Figure 5:
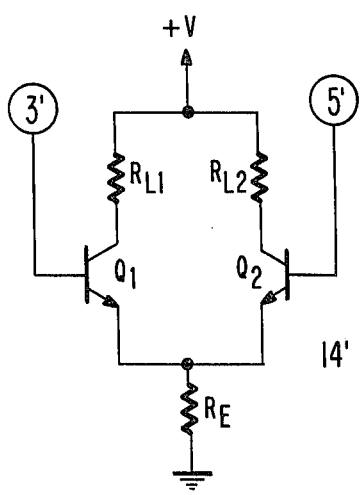
FIG. 5 is a schematic diagram of a bipolar sense circuit which may be used in a circuit embodying the invention.

The signal and reference circuits may also be compensated for the condition where their outputs are coupled to a circuit of the type shown in FIG. 5, whose equivalent input impedance is resistive (and not an equivalent current source). FIG. 5 shows a differential stage 14' comprised of two bipolar transistors (Q1, Q2) connected at their bases to nodes 3 and 5, respectively. The equivalent circuit of the memory, the reference, and the sense circuit may then be represented as shown in FIG. 6.

$R_5$ represents the input impedance looking into the base of Q1 and $R_6$ represents the input impedance looking into the base of Q2.

Figure 6:
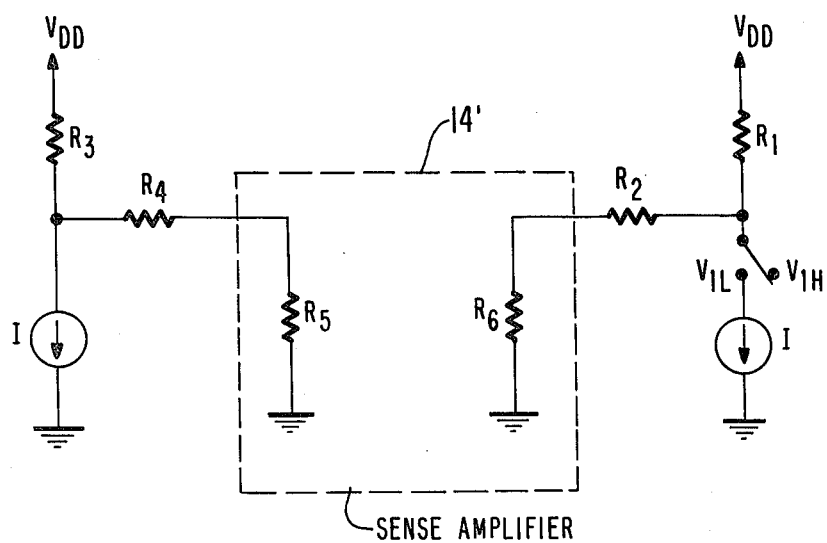
FIG. 6 is a simplified equivalent diagram of a circuit embodying the invention using a sense circuit of the type shown in FIG. 5.

Analysis of the circuit of FIG. 6 is as follows:

$$V_{SH} = \frac{R_6}{R_1 + R_2 + R_6} V_{DD}$$

$$V_{SL} = \frac{R_6}{R_1 + R_2 + R_6} V_L$$

where $V_L = V_{DD} - IR_1$ $$V_R = \frac{R_5}{R_3 + R_4 + R_5} V_2$$

where $V_2 = V_{DD} - IR_3$

To set $V_R$ midway between $V_{SH}$ and $V_{SL}$ $$V_{SH} - V_R = \left[ \frac{R_6}{R_1 + R_2 + R_6} \right] \cdot V_{DD} - \left[ \frac{R_5}{R_3 + R_4 + R_5} \right] \cdot V_2$$

must be made equal to:

$$V_R - V_{SL} = \left[ \frac{R_5}{R_3 + R_4 + R_5} \right] \cdot V_2 - \left[ \frac{R_6}{R_1 + R_2 + R_6} \right] \cdot V_L$$

This may be satisfied when $V_2 = [V_{DD} + V_L]/2$ and $$\frac{R_6}{R_1 + R_2 + R_6} = \frac{R_5}{R_3 + R_4 + R_5}$$

solving for $R_4$ indicates that:

$$R_4 = \frac{R_5}{R_6}(R_1 + R_2 + R_6) - R_3 - R_5$$

The sum of $R_3$ and $R_4$ which is equal to the total impedance looking back from node 3 into the reference circuit to AC ground may be expressed as:

$$R_3 + R_4 = R_5/R_6(R_1 + R_2)$$

where, $R_5$ and $R_6$ represent the impedances looking into input nodes 3 and 5, respectively, of sense amplifier 14'. Therefore, $R_5/R_6$ corresponds to the term K described above. For $V_3$ and $V_5$ approximately equal, the ratio of $R_5$ and $R_6$ is essentially equal to the $K=1$ condition discussed above.

What is claimed is:

1. The combination comprising:
   a signal generator having an equivalent source impedance $R_1$ and producing signals at its output having either one of first ($V_{1H}$) and second ($V_{1L}$) values;
   a reference generator having an equivalent source impedance $R_3$, and producing a signal at its output having a value intermediate $V_{1H}$ and $V_{1L}$;
   a sense amplifier having first and second inputs and an output, said sense amplifier being responsive to the signals at its first and second inputs and producing a signal at its output indicative of the signal at its first input being more positive than, equal to, or less positive than, the signal at its second input, said sense amplifier being further characterized in that there is a load current associated with each one of its first and second inputs in response to the applied input signals;
   a first coupling means having an impedance $R_2$ connected between the output of the signal generator and said first input of said sense amplifier; and
   a second coupling means connected between the output of said reference generator and said second input, said second coupling means having an impedance $R_4$ such that: $R_4 = K(R_1 + R_2) - R_3$, where K is equal to the ratio of the current flowing through said first input to that flowing through said second input of said sense amplifier, and $R_1$, $R_2$, and $R_3$ represent the ohmic values of said signal generator source impedance, of said first coupling means impedance, and of said reference generator source impedance, respectively.

2. The combination as claimed in claim 1, wherein said first coupling means is a first transmission gate and wherein $R_2$ is the ohmic value of the ON impedance of said first transmission gate, and wherein said second coupling means is a second transmission gate and wherein $R_4$ is the ohmic value of the ON impedance of said second transmission gate.

3. The combination as claimed in claim 2 wherein said signal generator includes first impedance means connected between a first point of operating potential and said output of said signal generator, and a first relatively constant current generator selectively connected between said output of said signal generator and a second point of operating potential, and
   wherein said reference generator includes a second impedance means connected between said first point of operating potential and said output of said reference generator, and a second relatively constant current generator connected between said output of said reference generator and said second point of operating potential.

4. The combination as claimed in claim 3 wherein the ohmic value of said first impedance is substantially equal to the source impedance $R_1$ of said signal generator, wherein the ohmic value of said second impedance is substantially equal to the source impedance $R_3$ of said reference generator, wherein $R_3$ is equal to $R_1/2$; and wherein said first relatively constant current generator produces a current which is substantially equal to the current produced by said second relatively constant current generator.

5. The combination as claimed in claim 4 wherein said signal generator is a memory cell, wherein said first impedance means is a first IGFET having its conduction path connected between said first point of operating potential and said output of said signal generator;

wherein said first relatively constant current generator is a second IGFET having its conduction path connected between said first output and said second point of operating potential; and wherein the impedance of the conduction path of said second IGFET, for the same turn-on bias condition, is substantially greater than the impedance of the conduction path of said first IGFET.

6. The combination as claimed in claim 5 wherein said second impedance is a third IGFET having its conduction path connected between said output of said reference generator and said first point of operating potential;

wherein the impedance of the conduction path of said third IGFET is less than the impedance of the conduction path of said first IGFET for the same turn on bias condition;

wherein said second relatively constant current generator is a fourth IGFET having its conduction path connected between said output of said reference generator and said second point of operating potential; and wherein the impedance of the conduction path of said fourth IGFET is approximately equal to that of said second IGFET.

7. The combination as claimed in claim 6 wherein said first transmission gate is a fifth IGFET having its conduction path connected between said output of said signal generator and said first input of said sense amplifier;

wherein said second transmission gate is a sixth IGFET having its conduction path connected between said output of said reference generator and said second input of said sense amplifier; and wherein the impedance of the conduction path of said sixth IGFET is made greater than the impedance of the conduction path of said fifth IGFET to compensate for the difference in the impedances of the conduction paths of said first and third IGFETs.

8. The combination as claimed in claim 7 wherein said sense amplifier includes at least a first amplifying transistor having a conduction path connected between said first input and said second point of operating potential, and at least a second amplifying transistor having a conduction path connected between said second input and said second point of operating potential.

9. The combination as claimed in claim 1 wherein $R_3$ is equal to: $R_1[1-C]$, where C is a fraction less than one.

* * * * *